US009595288B1

(12) United States Patent
Chu et al.

(10) Patent No.: US 9,595,288 B1
(45) Date of Patent: Mar. 14, 2017

(54) LASER MODE HOPPING DETECTION IN A HEAT-ASSISTED MAGNETIC RECORDING DRIVE

(71) Applicant: Seagate Technology LLC, Cupertino, CA (US)

(72) Inventors: Alfredo Sam Chu, Prior Lake, MN (US); Pu-Ling Lu, Rosemount, MN (US); Franklin P. Martens, Bloomington, MN (US); John W. Dykes, Eden Prairie, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 15/155,973

(22) Filed: May 16, 2016

(51) Int. Cl.
  *G11B 27/36* (2006.01)
  *G11B 7/1267* (2012.01)
  *G11B 5/00* (2006.01)
(52) U.S. Cl.
  CPC ............ *G11B 7/1267* (2013.01); *G11B 27/36* (2013.01); *G11B 2005/0021* (2013.01)
(58) Field of Classification Search
  CPC ........... G11B 5/012; G11B 27/36; G11B 5/02; G11B 5/314

USPC ............ 360/25, 31, 59, 53; 369/13.27, 120, 369/112.23
See application file for complete search history.

(56) References Cited

U.S. PATENT DOCUMENTS

| 4,737,798 A | 4/1988 | Lonis et al. |
| 5,048,031 A | 9/1991 | Thonn |
| 5,537,381 A * | 7/1996 | Fuji ..................... G11B 7/0045 369/13.27 |
| 8,570,842 B1 | 10/2013 | Richter et al. |
| 9,135,937 B1 | 9/2015 | Goulakov |
| 9,136,666 B1 | 9/2015 | Norberg et al. |
| 2012/0093502 A1 | 4/2012 | Gottwald et al. |

* cited by examiner

*Primary Examiner* — Nabil Hindi
(74) *Attorney, Agent, or Firm* — Hollingsworth Davis, LLC (57) ABSTRACT

A method comprises performing a write operation using a heat-assisted magnetic recording (HAMR) drive operating at a plurality of temperatures. The method involves measuring a metric of write performance subsequent to the write operation at each of the operating temperatures. The method also involves detecting one or more laser mode hops using the metrics, and determining a temperature at which each of the detected mode hops occurred. The method further involves storing the temperature for each detected mode hop in a non-volatile memory of the drive. The method may involve mitigating laser mode hopping, such as by the drive avoiding the stored temperature(s).

20 Claims, 11 Drawing Sheets

LASER MODE HOPPING DETECTION IN A HEAT-ASSISTED MAGNETIC RECORDING DRIVE

SUMMARY

Embodiments are directed to a method comprising performing a write operation using a heat-assisted magnetic recording (HAMR) drive operating at a plurality of temperatures. The method involves measuring a metric of write performance subsequent to the write operation at each of the operating temperatures. The method also involves detecting one or more laser mode hops using the metrics, and determining a temperature at which each of the detected mode hops occurred. The method further involves storing the temperature for each detected mode hop in a non-volatile memory of the drive. According to some embodiments, the method involves mitigating laser mode hopping, such as by the drive avoiding the stored temperature(s).

Other embodiments are directed to an apparatus comprising a HAMR drive comprising at least a writer, a laser diode, a reader, a controller, and a non-volatile memory. The controller is configured to perform a write operation at a plurality of temperatures, and measure a metric of write performance subsequent to the write operation at each of the operating temperatures. The controller is also configured to detect one or more laser mode hops using the metrics, determine a temperature at which each of the detected mode hops occurred, and store the temperature for each detected mode hop in the memory. According to some embodiments, the apparatus is configured to mitigate laser mode hopping, such as by the controller avoiding the temperature(s) stored in the memory.

The above summary is not intended to describe each disclosed embodiment or every implementation of the present disclosure. The figures and the detailed description below more particularly exemplify illustrative embodiments.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

The present disclosure generally relates to heat-assisted magnetic recording (HAMR), also referred to as energy-assisted magnetic recording (EAMR), thermally-assisted magnetic recording (TAMR), and thermally-assisted recording (TAR). This technology uses a laser source and a near-field transducer (NFT) to heat a small spot on a magnetic disk during recording. The heat lowers magnetic coercivity at the spot, allowing a write transducer to change the orientation of a magnetic domain at the spot. Due to the relatively high coercivity of the medium after cooling, the data is less susceptible to paramagnetic effects that can lead to data errors.

In general, HAMR uses a laser to heat magnetic media near or above the Curie temperature during recording. Stability of the laser power is important for recording performance since write width, magnetic transition location, and effective write field gradient highly depends on laser power. However, laser power stability is very challenging for HAMR due to various factors, including space limitations, high power density, strong optical feedback, and large environmental temperature variations.

Figure 1:
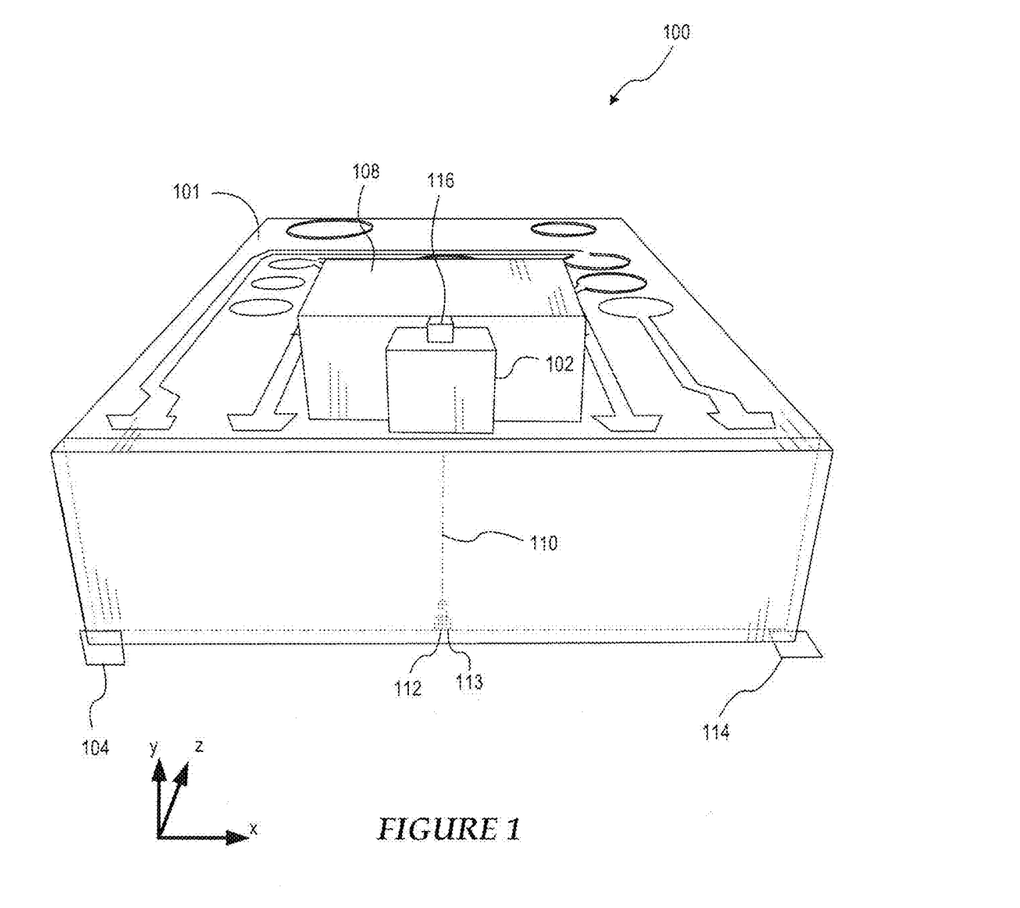
FIG. 1 is a perspective view of a HAMR slider with which various embodiments disclosed herein may be implemented.
Figure 2:
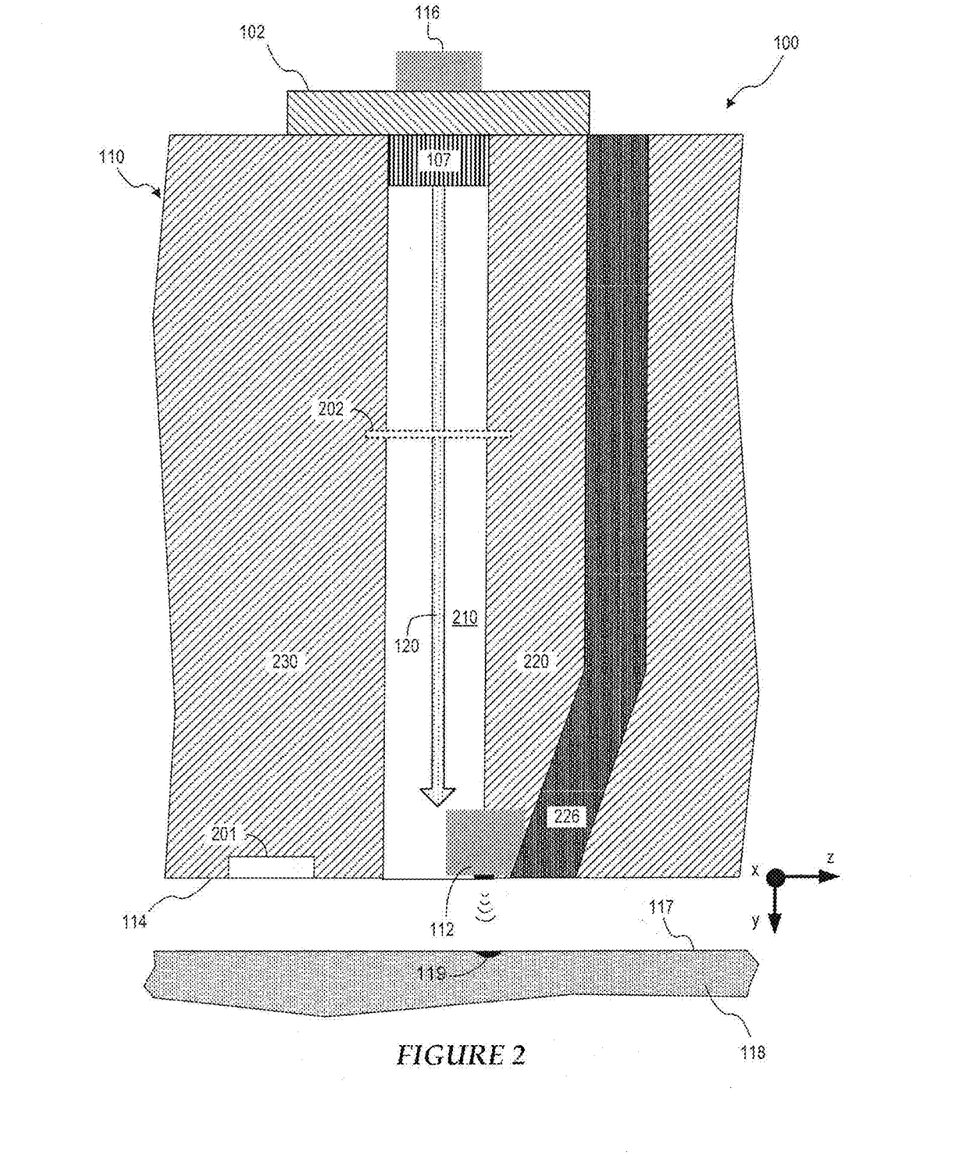
FIG. 2 is a cross-sectional view of a HAMR slider with which various embodiments disclosed herein may be implemented.

Embodiments of a representative HAMR head 100 are illustrated in FIGS. 1 and 2. As shown, the head 100 (also referred to as a slider) includes a light source (e.g., a laser diode) 102 located proximate a trailing edge surface 104 of the slider body 101. An optical wave (e.g., a laser beam) 120 generated by the light source 102 is delivered to an NFT 112 via an optical waveguide 110. The NFT 112 is aligned with a plane of an air bearing surface (ABS) 114 of the head 100, and one edge of a read/write head 113 is on the ABS 114. The read/write head 113 includes at least one writer and at least one reader. In some embodiments, multiple writers (e.g., 2 writers) and multiple readers (e.g., 3 readers) can be incorporated into the read/write head 113. The ABS 114 faces, and is held proximate to, a surface 117 of a magnetic medium 118 during device operation. The ABS 114 is also referred to as a media-facing surface.

The light source 102 in this representative example may be an integral, edge firing device, although it will be appreciated that any source of electromagnetic energy may be used. For example, a surface emitting laser (SEL), instead of an edge firing laser, may be used as the source 102. A light source may also be mounted alternatively to other surfaces of the head 100, such as the trailing edge surface 104. While the representative embodiments of FIGS. 1 and 2 show the waveguide 110 integrated with the head 100, any type of light delivery configuration may be used.

As shown in FIG. 1, the laser diode 102 is shown coupled to the slider body 101 via a submount 108. The submount 108 can be used to orient and affix an edge-emitting laser diode 102 so that its output is directed downwards (negative y-direction in the figure). An input surface of the slider body 101 may include a grating, and optical coupler or other coupling features to receive light from the laser diode 102. The head 100 also includes an optical energy measurement sensor, such as photodetector 116 (e.g., a photodiode), situated proximate the light source 102. The photodetector 116 is configured to measure of intensity the laser light output.

When writing with a HAMR device, electromagnetic energy is concentrated onto a small hotspot 119 over the track of the magnetic medium 118 where writing takes place, as is shown in the embodiment of FIG. 2. The light from the light source 102 propagates to the NFT 112, e.g., either directly from the light source 102 or through a mode converter or by way of a focusing element. FIG. 2, for example, shows an optical coupler 107 adjacent the light source 102, which is configured to couple light produced from the light source 102 to the waveguide 110.

As a result of what is known as the diffraction limit, optical components cannot be used to focus light to a dimension that is less than about half the wavelength of the light. The lasers used in some HAMR designs produce light with wavelengths on the order of 700-1550 nm, yet the desired hot spot 119 is on the order of 50 nm or less. Thus, the desired hot spot size is well below half the wavelength of the light. Optical focusers cannot be used to obtain the desired hot spot size, being diffraction limited at this scale. As a result, the NFT 112 is employed to create a hotspot on the media.

The NFT 112 is a near-field optics device configured to generate local surface plasmon resonance at a designated (e.g., design) wavelength. The NFT 112 is generally formed from a thin film of plasmonic material on a substrate. In a HAMR head 100, the NFT 112 is positioned proximate the write pole 226 of the read/write head 113. The NFT 112 is aligned with the plane of the ABS 114 parallel to the surface 116 of the magnetic medium 118. The waveguide 110 and optional mode converter and/or other optical element directs electromagnetic energy 120 (e.g., laser light) onto the NFT 112. The NFT 112 achieves surface plasmon resonance in response to the incident electromagnetic energy 120. The plasmons generated by this resonance are emitted from the NFT 112 towards the magnetic medium 118 where they are absorbed to create a hotspot 119. At resonance, a high electric field surrounds the NFT 112 due to the collective oscillations of electrons at the metal surface (e.g., substrate) of the magnetic medium 118. At least a portion of the electric field surrounding the NFT 112 gets absorbed by the magnetic medium 118, thereby raising the temperature of a spot 119 on the medium 118 as data is being recorded.

FIG. 2 shows a detailed partial cross-sectional view of an embodiment of the HAMR head 100 in accordance with various embodiments. The waveguide 110 includes a layer of core material 210 surrounded by first and second cladding layers 220 and 230. The first cladding layer 220 is shown proximate the NFT 112 and the write pole 226. The second cladding layer 230 is spaced away from the first cladding layer 220 and separated therefrom by the waveguide core 210. The core layer 210 and cladding layers 220 and 230 may be fabricated from dielectric materials, such as optical grade amorphous material with low thermal conductivities. The first and second cladding layers 220 and 230 may each be made of the same or a different material. The materials are selected so that the refractive index of the core layer 210 is higher than refractive indices of the cladding layers 220 and 230. This arrangement of materials facilitates efficient propagation of light through the waveguide core 210. Optical focusing elements (not shown) such as mirrors, lenses, etc., may be utilized to concentrate light onto the NFT 112. These and other components may be built on a common substrate using wafer manufacturing techniques known in the art. The waveguide 110 may be configured as a planar waveguide or channel waveguide.

According to some embodiments, the head 100 includes one or more contact sensors, such as the contact sensor 201 shown in FIG. 2. The contact sensor 201 can be configured to sense for one or more of head-medium contact, thermal asperities, and voids of a magnetic recording medium. The contact sensor 201 can be implemented as a thermal sensor, such as a resistive temperature sensor (e.g., TCR sensor). For example, the contact sensor 201 can be implemented as a DETCR (Differential Ended Thermal Coefficient of Resistance sensor). The contact sensor 201 can be implemented using other technologies, such as a thermocouple or a thermistor. The contact sensor 201 is situated at or near the ABS 114 and proximate the NFT 112. As such, the contact sensor 201 can serve as a temperature sensor for the NFT 112 (e.g., laser output power monitor), in addition to serving as a head-medium/asperity contact sensor.

According to some embodiments, the head 100 shown in FIG. 2 can incorporate a bolometer 202 situated in the vicinity of the light path (e.g., the waveguide 110) and proximal of the NFT 112 in accordance with various embodiments. According to some embodiments, the bolometer 202 comprises an optical-to-thermal transducer configured to respond to fluctuations in output optical power of the laser 102. In some embodiments, the bolometer 202 comprises a thin metallic wire placed across the light path (e.g., the waveguide 110) within the internal body of the slider 100 at a location between the coupler 107 and the NFT 112. A small fraction of the output optical power of the laser 102 transmitted via the light path is absorbed by the wire and converted into thermal power, thereby increasing wire temperature. Fluctuations in output optical power of the laser 102 correlate to fluctuations in thermal power and temperature of the bolometer 202. These fluctuations in temperature can be detected by circuitry configured to monitor the resistance fluctuations in the wire by using a small bias current and a high thermal coefficient of resistance material. The bolometer 202 can be placed in the light path or adjacent to optics to harvest scattered light.

The output of a laser diode used in a HAMR drive is temperature sensitive and susceptible to self-heating. During write operation, for example, laser diode heating can vary the junction temperature of the laser diode, causing a shift in laser emission wavelength, leading to a change of optical feedback from optical path in slider to the cavity of the laser diode, a phenomenon that is known to lead to mode hopping and/or power instability of the laser diode. Mode hopping is particularly problematic in the context of single-frequency lasers. Under some external influences, a single-frequency laser may operate on one resonator mode (e.g., produce energy with a first wavelength) for some time, but then suddenly switch to another mode (produce energy, often with different magnitude, with a second wavelength) performing "mode hopping." Temperature variation is known to cause mode hopping in laser diodes. For certain laser designs, for example, after the laser starts to lase but before it reaches temperature equilibrium, the laser output may hop from one power level to another due to laser gain changes with temperature. Mode hopping is problematic for HAMR applications, as mode hopping leads to laser output power jumping and magnetic transition shifting from one block of data to another. Large transition shifts in a block of data may not be recoverable by channel decoding, resulting in error bits. For example, when laser mode hopping occurs while the recording head is writing, it causes the written transition locations to shift, resulting in channel phase jumps during read back. If the channel phase jumps are too large, the data may not be recoverable or could have a poor bit error rate. Laser mode hopping can also lead to adjacent track interference (ATI), which can result in erasing data on an adjacent track because of higher laser power.

Embodiments of the disclosure are directed to methods and apparatuses that detect laser mode hopping by evaluating one or more metrics of write performance at a multiplicity of different operating temperatures of a HAMR drive. Some embodiments are directed to detecting and mitigating a laser mode hop. Embodiments can be implemented during manufacturing of a HAMR drive. Embodiments can be implemented during the service life of a HAMR drive.

Figure 3:
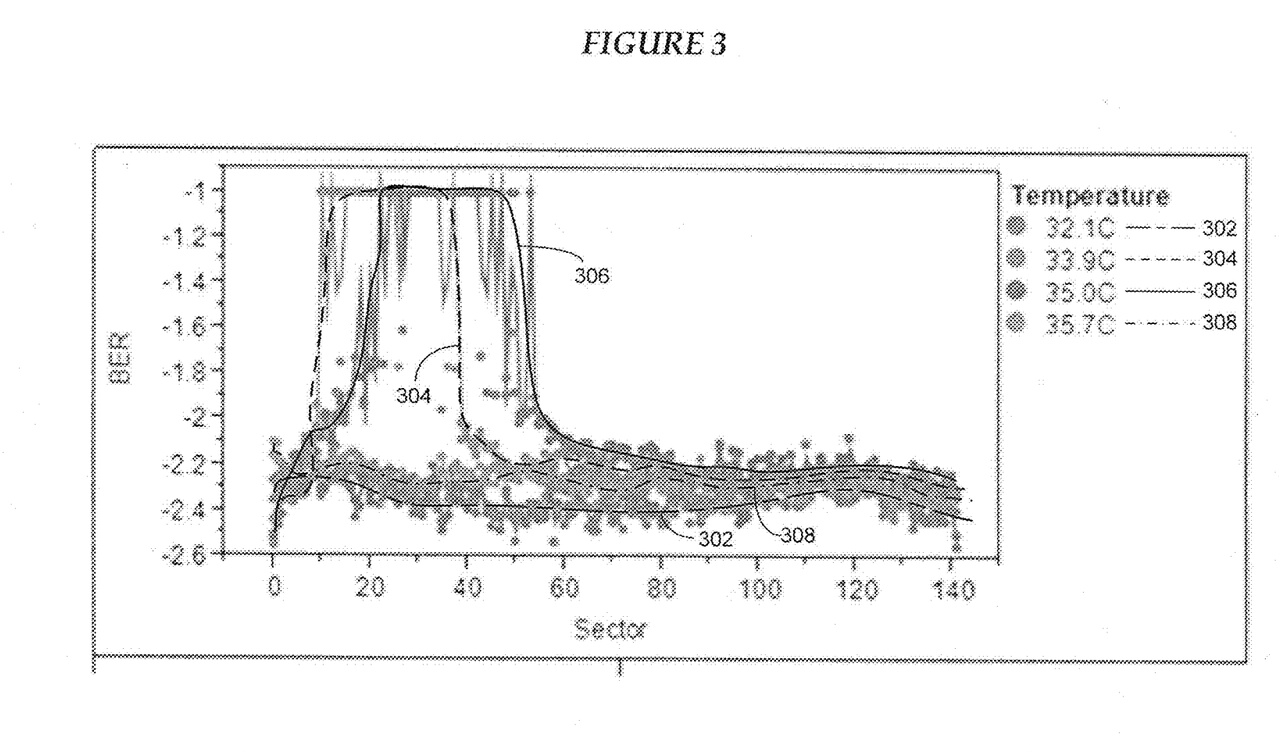
FIG. 3 is a graph of data that illustrates the temperature sensitivity of laser diode output in a HAMR drive in accordance with various embodiments.

FIG. 3 is a graph of data that illustrates the temperature sensitivity of laser diode output in a HAMR drive. FIG. 3 shows bit error rate as a function of sector for a HAMR drive under evaluation. It is noted that the BER was obtained by reading data immediately after writing data to the medium. In FIG. 3, four plots are shown, with curves 302, 304, 306, and 308 drawn through the plots for purposes of clarity. Curve 302 shows the BER at a drive operating temperature of 32.1° C. Curve 304 shows the BER at a drive operating temperature of 33.9° C. Curve 306 shows the BER at a drive operating temperature of 35.0° C. Curve 308 shows the BER at a drive operating temperature of 35.7° C. FIG. 3 shows that laser mode hopping occurred at drive operating temperatures of 33.9° C. (curve 304) and 35.0° C. (curve 306). FIG. 3 also shows that no laser mode hopping was observed at drive operating temperatures of 32.1° C. (curve 302) and 35.7° C. (curve 308). The data shown in FIG. 3 demonstrates laser mode hopping in a HAMR drive is highly temperature sensitive. The data of FIG. 3 shows that if mode hopping is measured only at a particular temperature or a narrow range of temperatures, then there is high probability that mode hopping detection will be missed.

Figure 4:
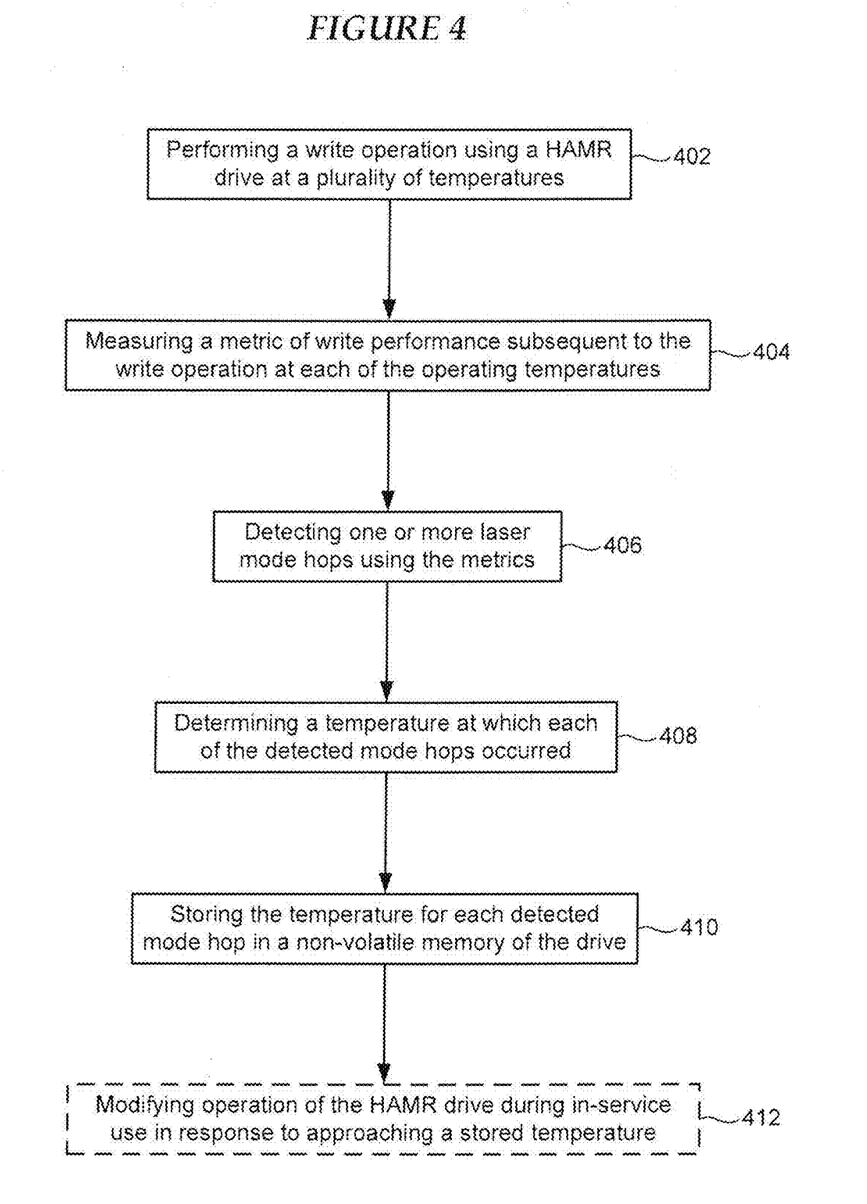
FIG. 4 illustrates a method of detecting and optionally mitigating laser mode hopping in a HAMR drive in accordance with various embodiments.

FIG. 4 illustrates a method of detecting and optionally mitigating laser mode hopping in a HAMR drive in accordance with various embodiments. The method shown in FIG. 4 involves performing 402 a write operation using a HAMR drive at a plurality of temperatures. The method involves measuring 404 a metric of write performance subsequent to the write operation at each of the operating temperatures. The method also involves detecting 406 one or more laser mode hops using the metrics, and determining 408 a temperature at which each of the detected mode hops occurred. The method further involves storing 410 the temperature for each detected mode hop in a non-volatile memory of the drive. In some embodiments disclosed herein, the HAMR drive is permitted to reach a substantially steady-state temperature at each operating temperature setting or increment before performing the various mode hopping detection processes. In other embodiments, the operating temperature of the drive is swept continuously through a predefined range of operating temperatures without necessarily reaching a steady-state temperature before performing the various mode hopping detection processes.

In some embodiments, the method also involves modifying 412 operation of the HAMR drive during in-service use of the drive in response to approaching one of the temperatures stored in the non-volatile memory of the drive. For example, operation of the HAMR drive can be modified to change the temperature of the drive (e.g., change the temperature of the laser diode) in an attempt to avoid reaching one of the temperatures stored in the non-volatile memory of the drive. By way of further example, if the current drive temperature is very close to one of the temperatures stored in the memory of the drive, drive operations can be modified to move the operating temperature through the stored temperature and into a safe zone between stored temperatures. Write operations to the medium can be temporarily suspended (instead, temporarily writing to flash memory) during the time in which the drive temperature moves through the stored temperature indicative of a critical temperature associated with a laser mode hop.

According to various embodiments, the metric of write performance used to detect a laser mode hop is bit error rate (e.g., read after write BER). Another metric of write performance that can be used to detect a laser mode hop is a phase shift in the read back signal acquired from the magnetic medium after writing to the medium. A significant phase shift in the read back signal occurs at the time of a laser mode hop. This phase shift corresponds to the physical shift (e.g., in nanometers) in one or more magnetic transitions due to the laser power variation caused by the mode hop. The magnitude of the phase shift in the read back signal can be used to detect a laser mode hop, such as by comparing the magnitude of a detected phase shift to a threshold indicative of a laser mode hop. An output of a digital phase lock loop (DPLL) of the drive's read channel provides a phase error signal that corresponds to the magnitude of the detected phase shift.

Another write performance metric that can be used to detect a laser mode hop is track width. More particularly, a sector-by-sector change in the track width beyond a threshold can indicate laser power variations due to a mode hop. For example, a variable gain amplifier (VGA) of the read channel can make gain adjustments in an attempt to compensate for changes in track width due to a laser mode hop. Gain adjustments made by the VGA (or other component/method) beyond a threshold can indicate occurrence of a laser mode hop.

Determining a temperature at which a detected mode hop occurred can be achieved using a temperature sensor in the HAMR drive. For example, a thermistor, thermocouple, or other type of temperature sensor within the HAMR drive can be used to determine the operating temperature of the drive. A preferred temperature sensor is one that is situated near the laser diode. In some embodiments, the temperature of the laser diode can be accurately estimated based on the voltage drop across the laser diode. For example, a voltage-temperature relationship (e.g., equation or lookup table) for the particular laser diode used in a HAMR drive can be stored in non-volatile memory of the HAMR drive. The current operating temperature of the laser diode can be determined using the measured voltage drop and the stored voltage-temperature relationship.

According to some embodiments, various actions can be taken to exacerbate the laser mode hop during a write operation. In order to enhance laser mode hop detection, it may be desirable to purposefully provoke a laser mode hop during a write operation. Various actions can be taken to increase the likelihood of a laser mode hop. In general, any action that marginalizes (e.g., reduces) the BER or other metric of write performance can be performed during a write operation in an effort to provoke a laser mode hop. Such actions include changing the head-disk clearance, modifying linear density (kBPI), performing off-track writing/reading, and adjusting the magnetic write current and/or the laser current, for example.

As is shown in FIG. 4, the method can involve modifying operation of the HAMR drive in response to approaching one of the stored temperatures in the non-volatile memory of the HAMR drive. Modifying operation of the HAMR drive can involve changing a temperature of the laser. Laser mode hops occur at multiple critical temperatures of the laser diode junction. Between these critical temperatures are temperature zones within which the likelihood of a laser mode hop is relatively low. As the temperature of the laser diode junction changes during a write operation, there is a risk that a critical temperature boundary may be crossed, resulting in a mode hop. Changing the operating temperature of the laser can serve to move the laser diode junction temperature into a zone of relatively low mode hopping risk. Alternatively, changing the operating temperature of the laser can serve to purposefully provoke a laser mode hop in order to determine and map the critical temperatures for the laser diode.

One approach to changing the operating temperature of the laser involves changing the laser bias current ($I_{bias}$) while keeping the total laser current ($I_{total}$) the same. The total laser current ($I_{total}$) refers to the total laser current applied to the laser diode. The laser bias current, $I_{bias}$, refers to the laser current that is applied to the laser diode in a HAMR head in write mode, but not doing writing. Laser bias current, $I_{bias}$, differs from the total laser current applied to the laser diode during writing, which is referred to as the laser operating current ($I_{op}$) (noting that $I_{op}=I_{total}-I_{bias}$). The laser bias current, $I_{bias}$, can be incrementally increased (or decreased) to change the operating temperature of the laser diode (e.g., in steps of +/−0.2 mA). While the laser bias current ($I_{bias}$) is being adjusted, the laser operating current ($I_{op}$) can also be adjusted in order to keep the total laser current ($I_{total}$) constant. Other approaches to changing the operating temperature of the laser involve writing a different number of revolutions, changing the duty cycle, or changing the ambient temperature of the HAMR drive or spin stand tester (which may be difficult during in-service use, but is easily done during drive manufacturing).

Figure 5:
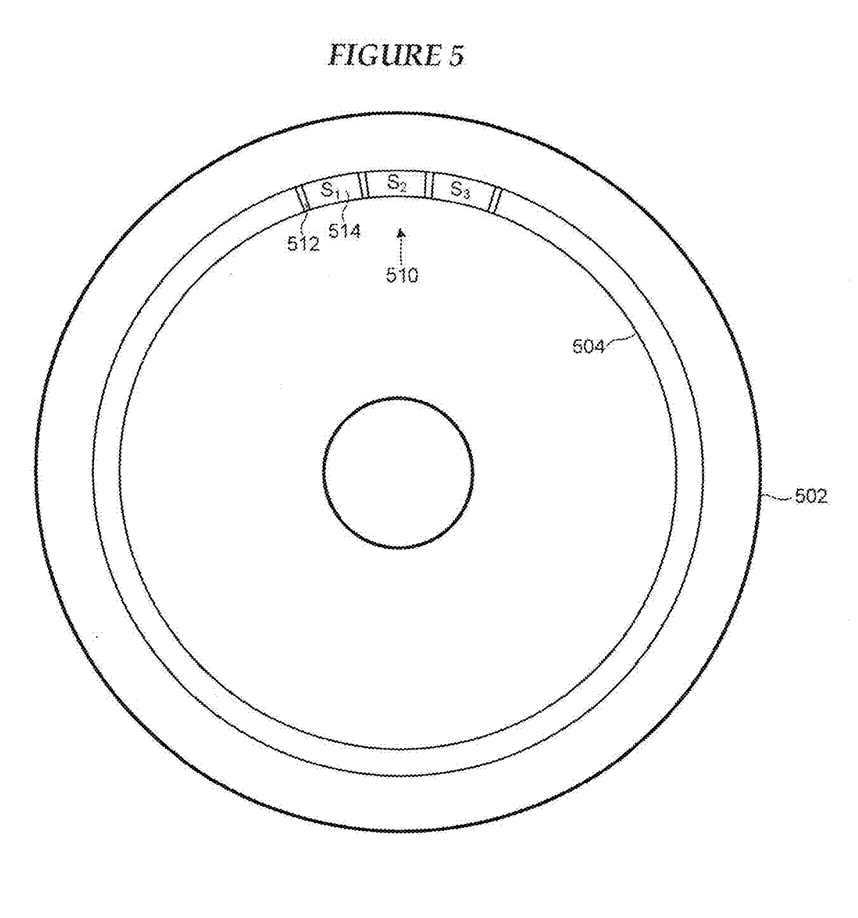
FIG. 5 shows a representative recording disk with which embodiments of the disclosure may be implemented.

In the following discussion, reference is made to two different writing operations. One writing operation is referred to as full track sequential writing. The other writing operation is referred to as sector writing. Reference is made to FIG. 5 to facilitate an understanding of these two writing operations. In FIG. 5, a track 504 of a recording disk 502 is shown to include a number of sectors 510, each of which includes a data sector 514 preceded by a servo sector 512. It is noted that a single track 504 can include, for example, between about 200 and 250 sectors 510. Writing a full track sequentially involves writing data to each data sector 510 of a particular track 504 sequentially during one complete revolution of the recording disk 502. Writing a full track sequentially requires a laser diode to be energized to significant amount of time during the complete revolution of the disk 502. Writing to the recording disk 502 using sector-based writing involves writing to a single sector 510, such as sector $S_1$, of a track 504, rotating the disk 502 one complete revolution, and then writing the adjacent sector, such as sector as $S_2$, of the track 504. Writing a single sector per disk revolution requires the laser diode to be energized for only a small fraction of time during the complete revolution of the disk 502.

In the methods discussed hereinbelow, various processes are performed at each of a plurality of different drive operating temperatures of a HARM drive. In general, the different operating temperatures typically correspond to a range of temperatures that a particular HAMR drive will be exposed to during normal operation in the field. The range of operating temperatures at which the various processes are performed is preferably wider than the normal operating temperature range of the drive to enhance drive reliability. The desired range of operating temperatures and specific temperature increments within the temperature range can be achieved by placing the HAMR drive in a temperature controlled test chamber.

According to some embodiments, method processes are performed every 2° C. increment of a temperature range defined by +/−6° C. from a current testing temperature of the drive. The current testing temperature of the drive can be in ambient temperature (e.g., room temperature, such as 30° C.). The current testing temperature of the drive can also be a temperature at which the customer typically operates the drive. In other embodiments, a more exhaustive detection methodology is implemented using a relatively wide range of operating temperatures. For example, the drive environmental operating temperature can range between 0° C. and 60° C., with the method processes being performed every 3° C. increment. It will be appreciated that these temperature ranges and increments are provided for non-limiting illustrative purposes, and can vary as needed or desired.

Figure 6:
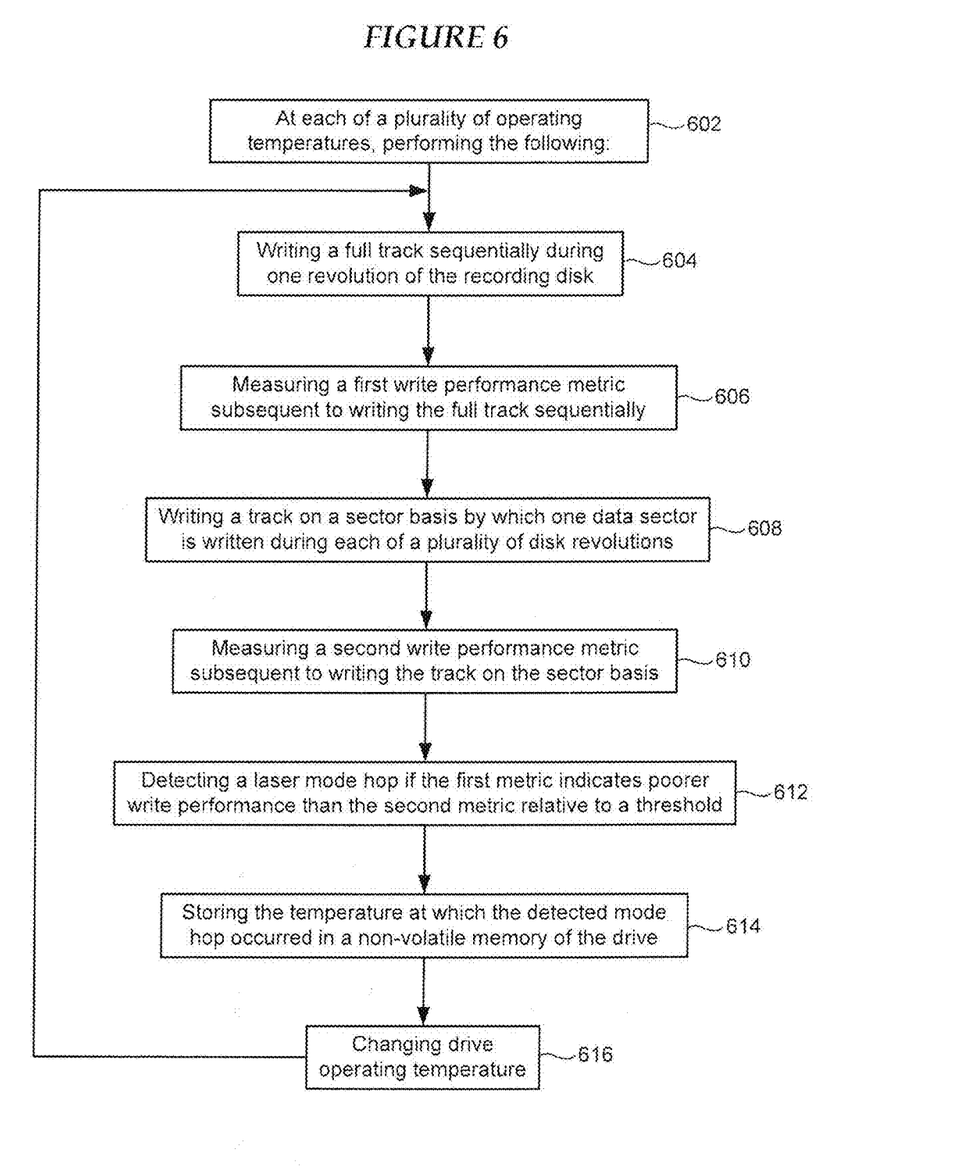
FIG. 6 illustrates a method of detecting laser mode hopping in a HAMR drive in accordance with various embodiments.

FIG. 6 illustrates a method of detecting laser mode hopping in a HAMR drive in accordance with various embodiments. The method shown in FIG. 6 involves performing 602 a number of processes (processes 604-614) at each of a plurality of different drive operating temperatures. The method involves writing 604 a full track sequentially during one revolution of the recording disk. The method also involves measuring 606 a first write performance metric (e.g., $BER_1$) subsequent to writing the full track sequentially. The method further involves writing 608 a track on a sector basis by which one data sector is written during each of a plurality of disk revolutions. The method involves measuring 610 a second write performance metric (e.g., $BER_2$) subsequent to writing the track on the sector basis.

The method further involves detecting 612 a laser mode hop if the first metric indicates poorer write performance than the second metric relative to a threshold. For example, if $BER_1$ (writing a full track) is poorer than $BER_2$ (writing by sector) by a threshold (e.g., 0.2 BER decades), then a laser mode hop is declared. In response to detecting a laser mode hop, the temperature at which the detected mode hop occurred is stored 614 in a non-volatile memory of the HAMR drive. The method involves changing 616 the drive operating temperature, and repeating the processes of blocks 604-614 at the new drive operating temperature. The method shown in FIG. 6 is repeated until the entire temperature range of interest has been swept.

Figure 7:
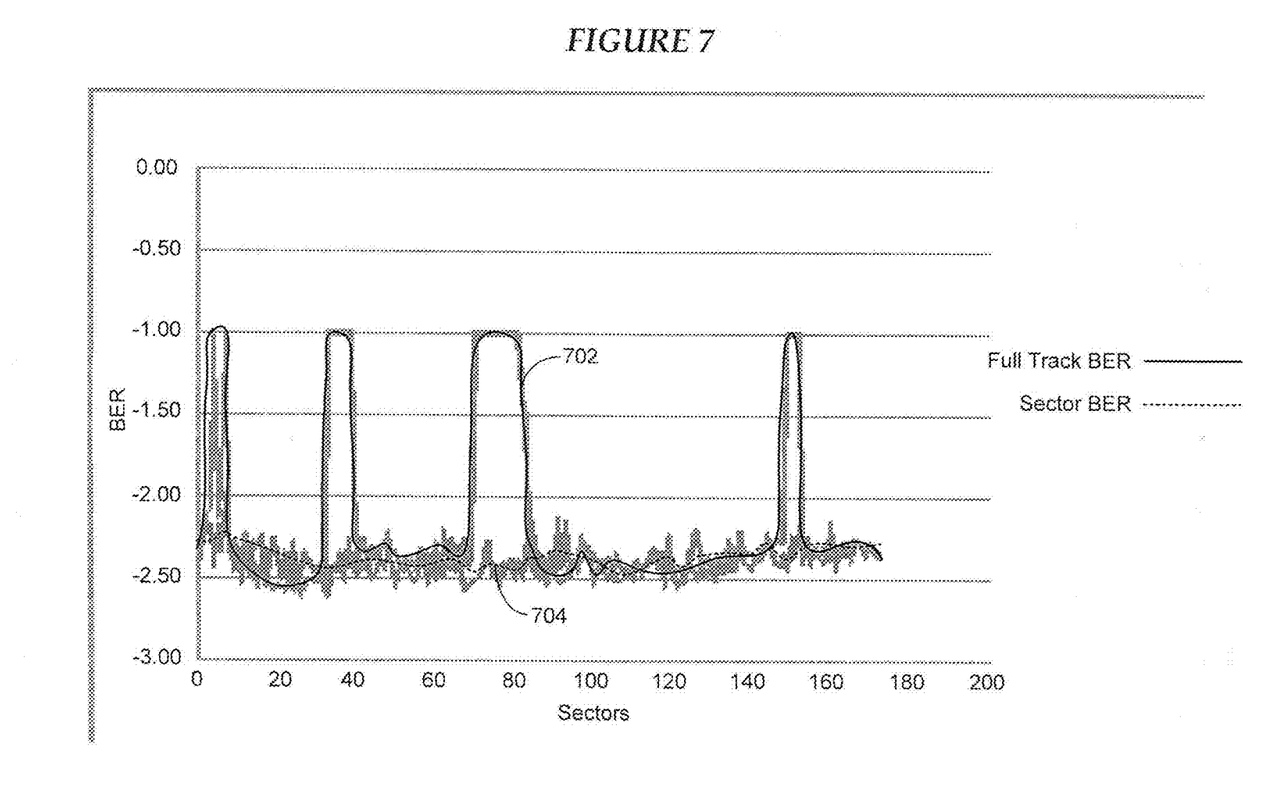
FIG. 7 is a graph showing the bit error rate (BER) for a track written using full track sequential writing and a track written using sector-based writing in accordance with the embodiment illustrated in FIG. 6.

FIG. 7 is a graph showing the BER for a track written using full track sequential writing and a track written using sector-based writing in accordance with the embodiment illustrated in FIG. 6. Curve 702 illustrates the full track sequential writing BER as a function of sectors, and curve 704 illustrates the sector-based writing BER as a function of sectors. Curves 702 and 704 were acquired at the same drive operating temperature. It can be seen in FIG. 7 that the sector-based BER curve 704 remains at a relatively constant BER, indicating an absence of laser mode hopping. In contrast, the full track sequential writing BER curve 702 varies significantly, and includes a number of step-wise jumps each indicative of a laser mode hop. A comparison can be made between the maximum excursions (e.g., abs (max−min) or abs(max−mean)) of curves 702 and 704, and this difference can be compared to a threshold (e.g., 0.2 BER decades). In the illustrative example shown in FIG. 7, it can be seen that the maximum excursion of curve 702 exceeds that of 704 by much more than 0.2 decades, clearly indicating the occurrence of several (e.g., 4) laser mode hops.

Figure 8:
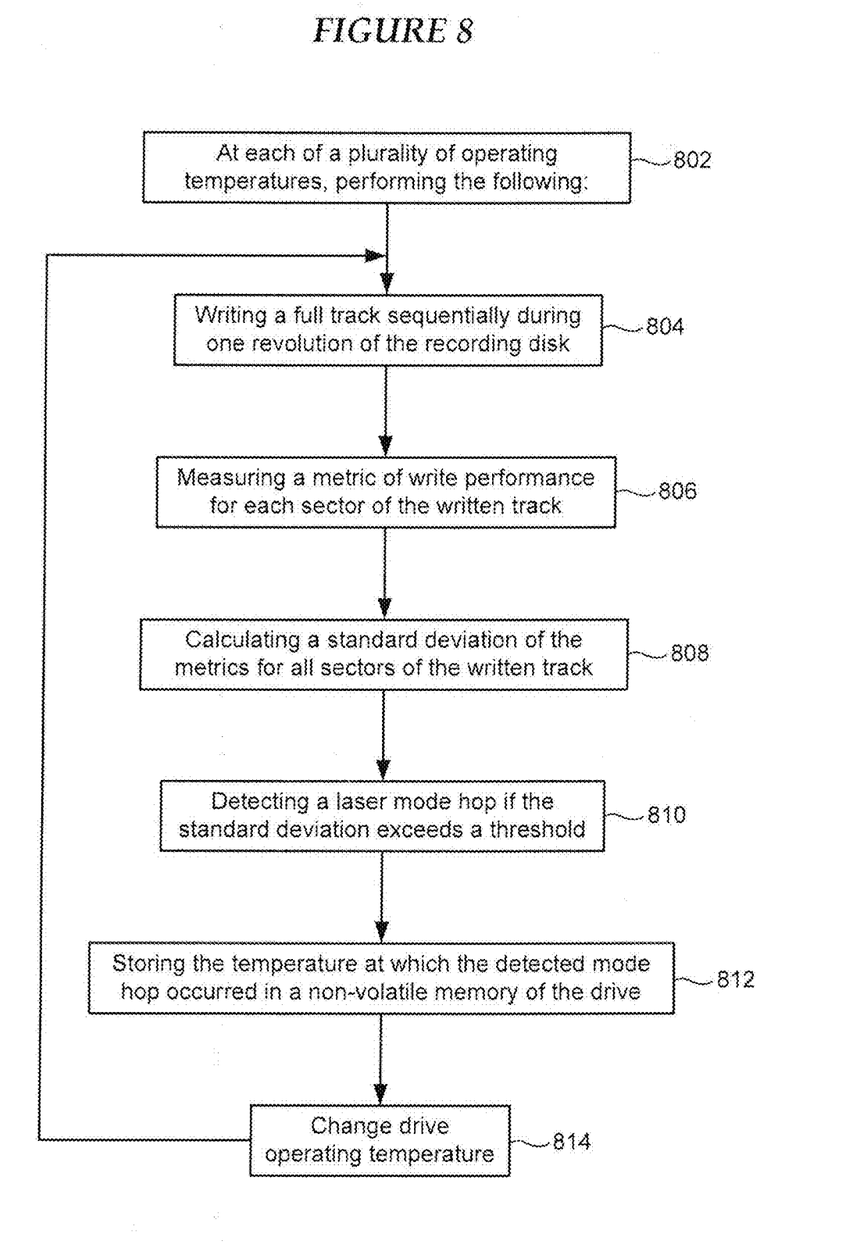
FIG. 8 illustrates a method of detecting laser mode hopping in a HAMR drive in accordance with various embodiments.

FIG. 8 illustrates a method of detecting laser mode hopping in a HAMR drive in accordance with various embodiments. The method shown in FIG. 8 involves performing 802 a number of processes (processes 804-812) at each of a plurality of different drive operating temperatures. The method involves writing 804 a full track sequentially during one revolution of the recording disk. The method also involves measuring 806 a metric of write performance (e.g., BER) for each sector (e.g., $BER_{S1}$, $BER_{S2}$ ... $BER_{Sn}$) of the written track. The method further involves calculating 808 a standard deviation of the metrics for all of the sectors of the written track. The method involves detecting 810 a laser mode hop if the standard deviation exceeds a threshold, Th (e.g., 0.5 decades). For example, if STD($BER_{S1}$, $BER_{S2}$ ... $BER_{Sn}$)>Th, then a laser mode hop is declared. In response to detecting a laser mode hop, the temperature at which the detected mode hop occurred is stored 812 in a non-volatile memory of the HAMR drive. The method involves changing 814 the drive operating temperature, and repeating the processes of blocks 804-812 at the new drive operating temperature. The method shown in FIG. 8 is repeated until the entire temperature range of interest has been swept.

Figure 9:
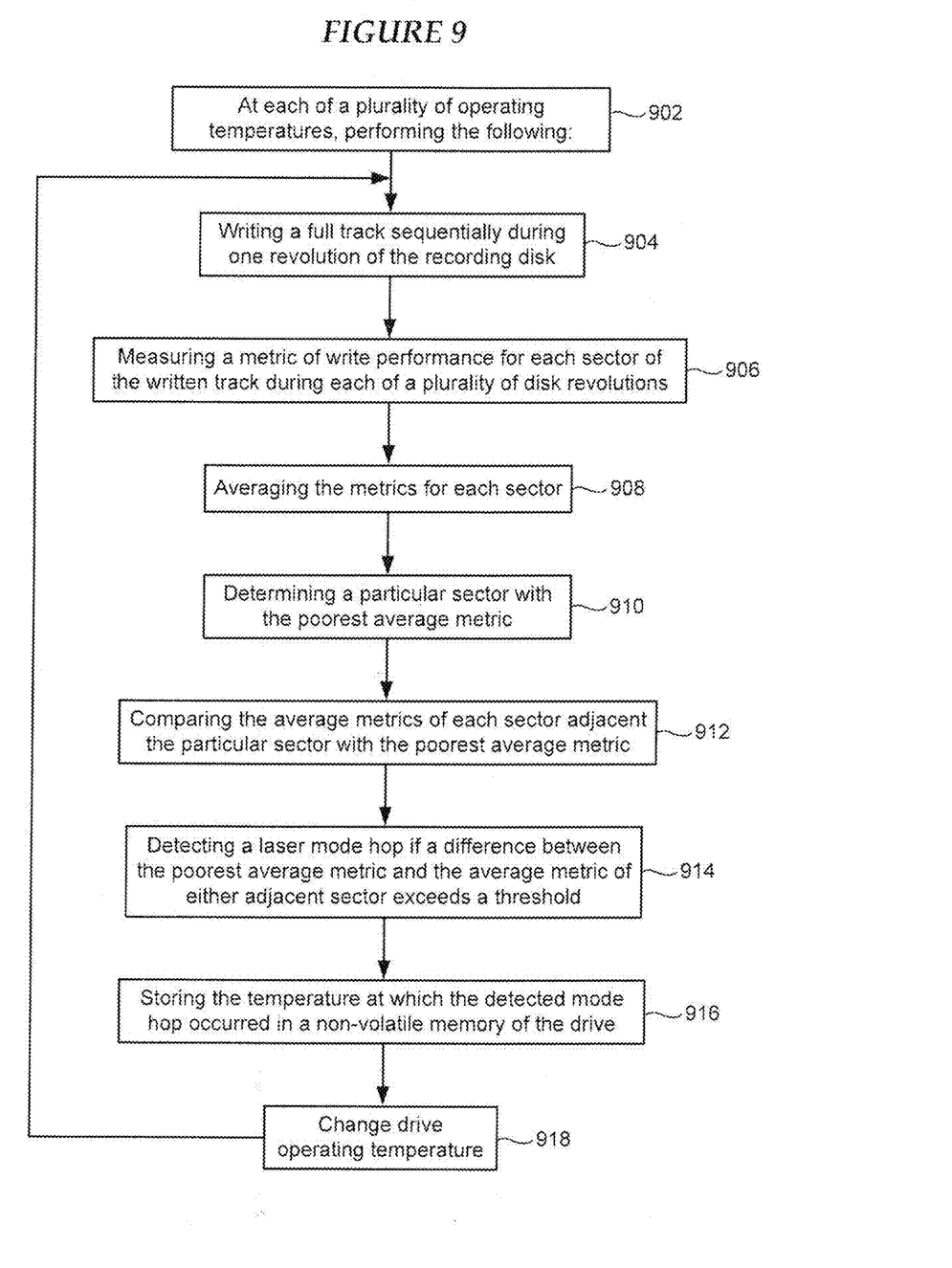
FIG. 9 illustrates a method of detecting laser mode hopping in a HAMR drive in accordance with various embodiments.

FIG. 9 illustrates a method of detecting laser mode hopping in a HAMR drive in accordance with various embodiments. The method shown in FIG. 9 involves performing 902 a number of processes (processes 904-916) at each of a plurality of different drive operating temperatures. The method involves writing 904 a full track sequentially during one revolution of the recording disk. The method also involves measuring 906 a metric of write performance for each sector of the written track during each of a plurality of disk revolutions, and averaging 908 the metrics for each sector. The method involves determining 910 a particular sector with the poorest average metric. The method further involves comparing 912 the average metrics of each sector adjacent the particular sector with the poorest average metric. A laser mode hop is detected 904 if the difference between the poorest average metric and the average metric of either adjacent sector exceeds a threshold (e.g., 0.3 BER decades).

For example, and with reference to FIG. 5, assume that the sector $S_2$ is determined to have the poorest average write performance metric. A first comparison is made between the average metric for sector $S_2$ and the average metric for adjacent sector $S_1$. A second comparison is made between the average metric for sector $S_2$ and the average metric for adjacent sector $S_3$. If either the first comparison or the second comparison yields a result that exceeds a threshold (e.g., 0.3 BER decades), then a laser mode hop is declared. In response to detecting a laser mode hop, the temperature at which the detected mode hop occurred is stored 916 in a non-volatile memory of the HAMR drive. The method involves changing 918 the drive operating temperature, and repeating the processes of blocks 904-916 at the new drive operating temperature. The method shown in FIG. 9 is repeated until the entire temperature range of interest has been swept.

Figure 10:
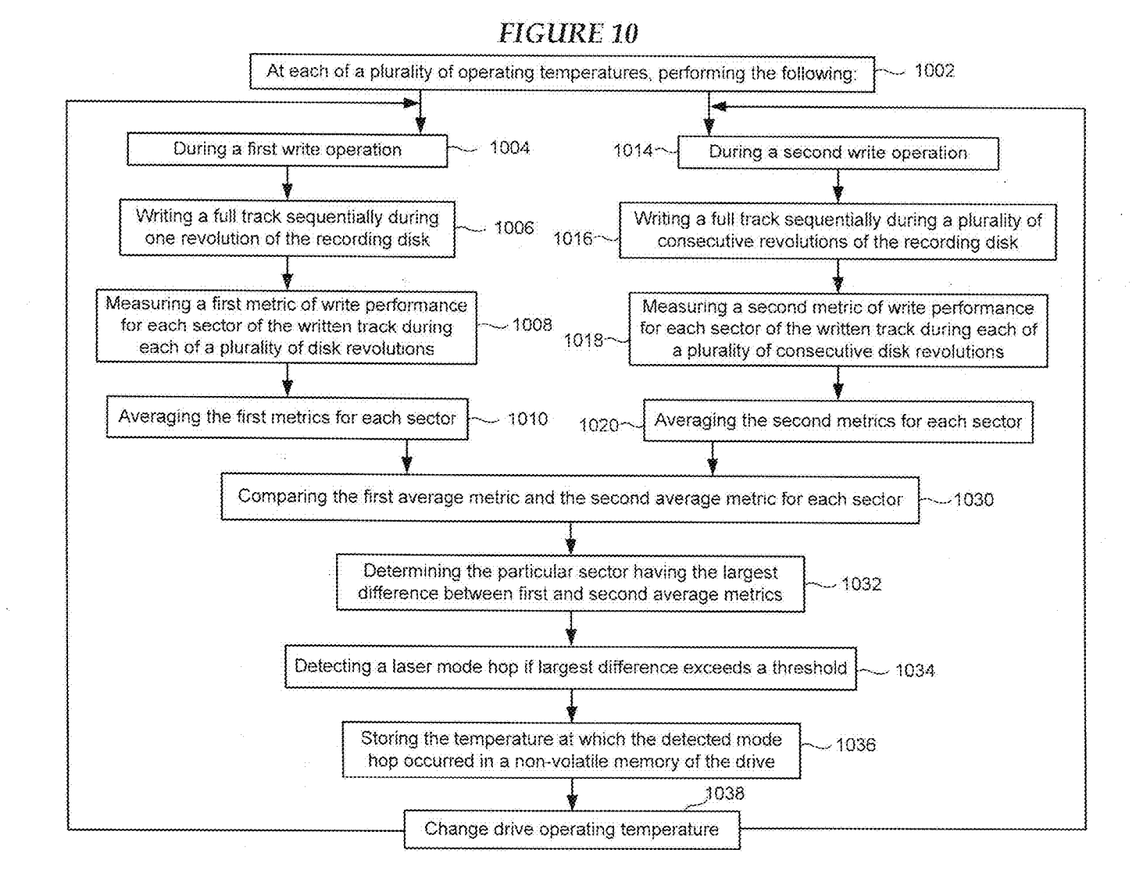
FIG. 10 illustrates a method of detecting laser mode hopping in a HAMR drive in accordance with various embodiments.

FIG. 10 illustrates a method of detecting laser mode hopping in a HAMR drive in accordance with various embodiments. The method shown in FIG. 10 involves performing 1002 a number of processes (processes 1004-1036) at each of a plurality of different drive operating temperatures. The processes shown in FIG. 10 involve performing two different write operations 1004 and 1014. During a first write operation 1004, a full track is sequentially written 1006 during one revolution of the recording disk. The method involves measuring 1008 a first metric of write performance for each sector of the written track during each of a plurality of disk revolutions. The method also involves averaging 1010 the first metrics for each sector of the written track (e.g., $BER1_{AVG-S1}$, $BER1_{AVG-S2}$, ... $BER1_{AVG-Sn}$). During a second write operation 1014, a full track is sequentially written 1016 during a plurality of consecutive revolutions of the recording disk (in contrast to the first write operation 1006 where a full track is sequentially written during one disk revolution). The method involves measuring 1018 a second metric of write performance for each sector of the written track during each of a plurality of consecutive disk revolutions. The method also involves averaging 1020 the second metric for each sector of the track (e.g., $BER2_{AVG-S1}$, $BER2_{AVG-S2}$, ... $BER2_{AVG-Sn}$).

The method shown in FIG. 10 involves comparing 1030 the first average metric and the second average metric for each sector (e.g., comparing $BER1_{AVG-S1}$ with $BER2_{AVG-S1}$, ... $BER1_{AVG-Sn}$ with $BER2_{AVG-Sn}$). The method also involves determining 1032 the particular sector (e.g., sector $S_3$) having the largest difference between first and second average metrics (e.g., abs($BER1_{AVG-S3}$−$BER2_{AVG-S3}$)). This difference is compared to a threshold (e.g., 0.2 or 0.3 BER decades), and a laser mode hop is detected 1034 if this difference exceeds the threshold. In response to detecting a laser mode hop, the temperature at which the detected mode hop occurred is stored 1036 in a non-volatile memory of the HAMR drive. The method involves changing 1038 the drive operating temperature, and repeating the processes of blocks 1004-1036 at the new drive operating temperature. The method shown in FIG. 10 is repeated until the entire temperature range of interest has been swept.

Figure 11:
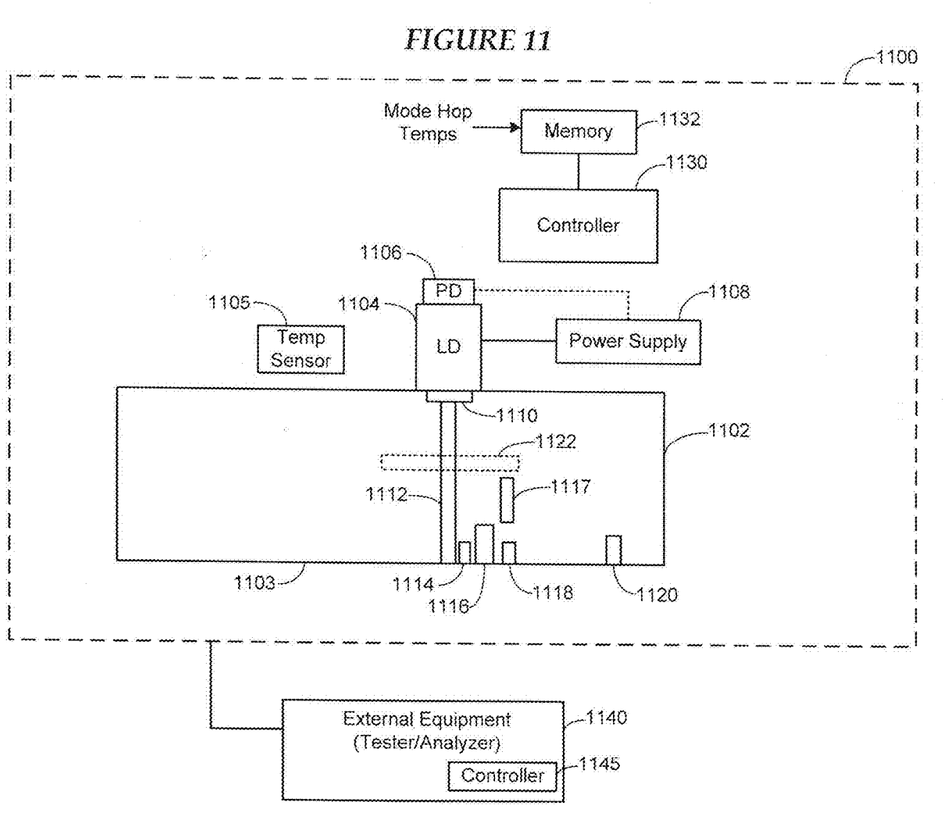
FIG. 11 is a block diagram of a system for detecting laser mode hopping and optionally mitigating same in accordance with various embodiments.

FIG. 11 is a block diagram of a system for detecting and optionally mitigating laser mode hopping in accordance with various embodiments. FIG. 11 shows a portion of a HAMR drive 1100 which includes a slider 1102 upon which a laser diode 1104 is mounted. A photodetector 1106 is mounted on or in close proximity to the laser diode 1104. A power supply 1108 is coupled to the laser diode 1104 and provides a supply current to the laser diode 1104. An output of the photodetector 1106 is coupled to the power supply 1108. The power supply 1108 can adjust the current supplied to the laser diode 1104 in response to the photodetector output. A temperature sensor 1105 is situated in the HAMR drive 1100, preferably at a location near or adjacent the laser diode 1104.

The slider 1102 includes a number of components including an optical waveguide 1112 which is optically coupled to the laser diode 1104 via an optical coupler 1110. The optical waveguide 1112 extends from the optical coupler 1110 to the NFT 1114 situated at the air bearing surface 1103 proximate the optical waveguide 1112. In some embodiments, a bolometer 1122 is situated proximate the optical waveguide 1112. A writer 1116 is situated proximate the NFT 1114. A heater 1117 is situated proximate the writer 1116 and configured to thermally actuate the writer 1116. A contact sensor 1118 is situated proximate the writer 1116 and NFT 1114 (e.g., at a close point of the writer). A reader 1120 is shown positioned away from the writer 1116 and contact sensor 1118.

The HAMR drive 1100 further includes a controller 1130 (e.g., processor) coupled to a non-volatile memory 1132. The controller 1130 is configured to detect laser mode hopping in accordance with various embodiments described hereinabove, including calculating the previously described metrics of write performance. In response to detecting a laser mode hop, the controller 1130 stores the current temperature measured by the temperature sensor 1105 in the memory 1132. The controller 1130 is configured to adjust the drive temperature during laser mode hop detection in a manner discussed hereinabove. The controller 1130 is also configured to mitigate laser mode hopping in a manner discussed hereinabove to avoid the temperature(s) stored in the memory 1132, such as by changing the operating temperature of the drive 1100 which changes the temperature of the laser diode 1104.

In some embodiments, external equipment 1140 (tester/analyzer) is coupled to the HAMR drive 1100 and used during manufacture or design development, for example. The external equipment 1140 includes a controller 1145 (or processor) which cooperates with the controller 1130 of the HAMR drive 1100. The controller 1145 of the tester/analyzer 1140 is configured to perform some or all of the functions attributed to the controller 1130 of the drive 1100 when detecting laser mode hopping and optionally mitigating same.

Systems, devices or methods disclosed herein may include one or more of the features structures, methods, or combination thereof described herein. For example, a device or method may be implemented to include one or more of the features and/or processes above. It is intended that such device or method need not include all of the features and/or processes described herein, but may be implemented to include selected features and/or processes that provide useful structures and/or functionality. Various modifications and additions can be made to the disclosed embodiments discussed above. Accordingly, the scope of the present disclosure should not be limited by the particular embodiments described above, but should be defined only by the claims set forth below and equivalents thereof.

What is claimed is:

1. A method, comprising:
    performing a write operation using a heat-assisted magnetic recording (HAMR) drive operating at a plurality of temperatures;
    measuring a metric of write performance subsequent to the write operation at each of the operating temperatures;
    detecting one or more laser mode hops using the metrics;
    determining a temperature at which each of the detected mode hops occurred; and
    storing the temperature for each detected mode hop in a non-volatile memory of the drive.

2. The method of claim 1, wherein the plurality of temperatures comprise a range of operating temperatures above and below a predefined drive operating temperature.

3. The method of claim 1, wherein:
    the plurality of temperatures defines a range of temperatures divided into temperature increments; and
    the method is performed at each of the temperature increments.

4. The method of claim 3, wherein the drive is permitted to reach a substantially stead-state temperature at each of the temperature increments before performing the method at each of the temperature increments.

5. The method of claim 1, wherein the operating temperature of the drive is swept continuously through a predefined range of operating temperatures.

6. The method of claim 1, wherein performing, measuring, and detecting comprises:
    writing a full track sequentially during one revolution of a recording disk;
    measuring a first write performance metric subsequent to writing the full track sequentially;
    writing a track on a sector basis by which one data sector is written during each of a plurality of disk revolutions;
    measuring a second write performance metric subsequent to writing the track on the sector basis; and
    detecting a laser mode hop if the first metric indicates poorer write performance than the second metric relative to a threshold.

7. The method of claim 1, wherein performing, measuring, and detecting comprises:
    writing a full track sequentially during one revolution of a recording disk;
    measuring the metric of write performance for each sector of the written track;
    calculating a standard deviation of the metrics for all sectors of the written track; and
    detecting a laser mode hop if the standard deviation exceeds a threshold.

8. The method of claim 1, wherein performing, measuring, and detecting comprises:
    writing a full track sequentially during one revolution of a recording disk;
    measuring the metric of write performance for each sector of the written track during each of a plurality of disk revolutions;
    averaging the metrics for each sector;
    determining a particular sector with the poorest average metric;
    comparing the average metrics of each sector adjacent the particular sector with the poorest average metric; and
    detecting a laser mode hop if a difference between the poorest average metric and the average metric of either adjacent sector exceeds a threshold.

9. The method of claim 1, wherein performing, measuring, and detecting comprises:
    during a first write operation:
        writing a full track sequentially during one revolution of a recording disk;
        measuring a first metric of write performance for each sector of the written track during each of a plurality of disk revolutions;
        averaging the first metrics for each sector;
    during a second write operation:
        writing a full track sequentially during a plurality of consecutive revolutions of the recording disk;
        measuring a second metric of write performance for each sector of the written track during each of a plurality of consecutive disk revolutions;
        averaging the second metrics for each sector;
    comparing the first average metric and the second average metric for each sector;
    determining the particular sector having the largest difference between first and second average metrics; and
    detecting a laser mode hop if largest difference exceeds a threshold.

10. The method of claim 1, comprising modifying operation of the HAMR drive in response to an operating temperature of the drive approaching one of the stored temperatures.

11. The method of claim 1, comprising modifying a temperature of a laser diode of the HAMR drive in response to an operating temperature of the drive approaching one of the stored temperatures.

12. The method of claim 1, comprising, in response to the operating temperature of the drive approaching one of the stored temperatures:
    adjusting a laser bias current supplied to a laser diode of the HAMR drive; and adjusting an operating current supplied to the laser diode such that a total laser current remains constant during adjustment of the laser bias current.

13. An apparatus, comprising:
a heat-assisted magnetic recording (HAMR) drive comprising at least a writer, a laser diode, a reader, a controller, and a non-volatile memory;
the controller configured to:
perform a write operation at a plurality of temperatures;
measure a metric of write performance subsequent to the write operation at each of the operating temperatures;
detect one or more laser mode hops using the metrics;
determine a temperature at which each of the detected mode hops occurred; and
store the temperature for each detected mode hop in the memory.

14. The apparatus of claim 13, wherein the controller is configured to:
write a full track sequentially during one revolution of a recording disk;
measure a first write performance metric subsequent to writing the full track sequentially;
write a track on a sector basis by which one data sector is written during each of a plurality of disk revolutions;
measure a second write performance metric subsequent to writing the track on the sector basis; and
detect a laser mode hop if the first metric indicates poorer write performance than the second metric relative to a threshold.

15. The apparatus of claim 13, wherein the controller is configured to:
write a full track sequentially during one revolution of a recording disk;
measure the metric of write performance for each sector of the written track;
calculate a standard deviation of the metrics for all sectors of the written track; and
detect a laser mode hop if the standard deviation exceeds a threshold.

16. The apparatus of claim 13, wherein the controller is configured to:
write a full track sequentially during one revolution of a recording disk;
measure the metric of write performance for each sector of the written track during each of a plurality of disk revolutions;
average the metrics for each sector;

determine a particular sector with the poorest average metric;
compare the average metrics of each sector adjacent the particular sector with the poorest average metric; and
detect a laser mode hop if a difference between the poorest average metric and the average metric of either adjacent sector exceeds a threshold.

17. The apparatus of claim 13, wherein the controller is configured to:
during a first write operation:
write a full track sequentially during one revolution of a recording disk;
measure a first metric of write performance for each sector of the written track during each of a plurality of disk revolutions;
average the first metrics for each sector;
during a second write operation:
write a full track sequentially during a plurality of consecutive revolutions of the recording disk;
measure a second metric of write performance for each sector of the written track during each of a plurality of consecutive disk revolutions;
average the second metrics for each sector;
compare the first average metric and the second average metric for each sector;
determine the particular sector having a largest difference between the first and second average metrics; and
detect a laser mode hop if largest difference exceeds a threshold.

18. The apparatus of claim 13, wherein the controller is configured to modify operation of the HAMR drive in response to an operating temperature of the drive approaching one of the temperatures stored in the memory.

19. The apparatus of claim 13, wherein the controller is configured to modify a temperature of a laser diode of the HAMR drive in response to an operating temperature of the drive approaching one of the temperatures stored in the memory.

20. The apparatus of claim 13, wherein the controller is configured to, in response to the operating temperature of the drive approaching one of the temperatures stored in the memory:
adjust a laser bias current supplied to a laser diode of the HAMR drive; and
adjust an operating current supplied to the laser diode such that a total laser current remains constant during adjustment of the laser bias current.

* * * * *